United States Patent
Lee et al.

(10) Patent No.: US 12,194,831 B2
(45) Date of Patent: Jan. 14, 2025

(54) VEHICLE WATER-COOLING HEAT SINK PLATE HAVING FIN SETS WITH DIFFERENT FIN PITCH DISTANCES

(71) Applicant: AMULAIRE THERMAL TECHNOLOGY, INC., New Taipei (TW)

(72) Inventors: Kuo-Wei Lee, New Taipei (TW); Chun-Li Hsiung, New Taipei (TW); Chien-Cheng Wu, New Taipei (TW); Chun-Lung Wu, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 339 days.

(21) Appl. No.: 17/963,986

(22) Filed: Oct. 11, 2022

(65) Prior Publication Data
US 2024/0116356 A1    Apr. 11, 2024

(51) Int. Cl.
*H05K 7/20*    (2006.01)
*B60K 11/02*   (2006.01)
*B60K 1/00*    (2006.01)

(52) U.S. Cl.
CPC .......... *B60K 11/02* (2013.01); *H05K 7/20927* (2013.01); *B60K 2001/003* (2013.01)

(58) Field of Classification Search
CPC ................ B60K 2001/003; H05K 7/20927
See application file for complete search history.

(56) References Cited

U.S. PATENT DOCUMENTS

| | | | |
|---|---|---|---|
| 5,794,607 A | 8/1998 | Aihara et al. | |
| 2003/0151893 A1* | 8/2003 | Meyer | H02M 7/003 |
| | | | 361/689 |
| 2010/0172091 A1* | 7/2010 | Nishiura | H01L 23/473 |
| | | | 361/689 |
| 2012/0257354 A1* | 10/2012 | Dede | H01L 23/473 |
| | | | 361/689 |
| 2013/0112373 A1* | 5/2013 | Fukai | H01L 23/3672 |
| | | | 165/185 |

(Continued)

FOREIGN PATENT DOCUMENTS

| | | |
|---|---|---|
| CN | 102884877 B | 9/2015 |
| JP | 201639202 A | 3/2016 |
| TW | M616320 U | 9/2021 |

*Primary Examiner* — Brian L Swenson
(74) *Attorney, Agent, or Firm* — Li & Cai Intellectual Property Office

(57) ABSTRACT

A vehicle water-cooling heat sink plate having fin sets with different fin pitch distances is provided. The vehicle water-cooling heat sink plate includes a heat-dissipating plate body and three fin sets. The heat-dissipating plate body has a first heat-dissipating surface and a second heat-dissipating surface that are opposite to each other, the first heat-dissipating surface is used for contacting three traction inverter power component sets, and the second heat-dissipating surface is used for contacting a cooling fluid. The second heat-dissipating surface of the heat-dissipating plate body along a flow direction of the cooling fluid is divided into three heat-dissipating areas which are spaced apart from each other and have the same size, and the three heat-dissipating areas respectively correspond to three projection areas that are respectively generated by the three traction inverter power component sets.

9 Claims, 4 Drawing Sheets

(56) References Cited

U.S. PATENT DOCUMENTS

| | | | |
|---|---|---|---|
| 2017/0055378 A1* | 2/2017 | Zhou | H05K 7/20927 |
| 2017/0363375 A1* | 12/2017 | Mayor | F28F 3/022 |
| 2019/0239389 A1 | 8/2019 | Yamaguchi et al. | |
| 2020/0350232 A1* | 11/2020 | Gradinger | H01L 25/072 |
| 2023/0397384 A1* | 12/2023 | Park | H01L 23/4334 |
| 2024/0298428 A1* | 9/2024 | Kim | H01L 23/473 |

* cited by examiner

VEHICLE WATER-COOLING HEAT SINK PLATE HAVING FIN SETS WITH DIFFERENT FIN PITCH DISTANCES

FIELD OF THE DISCLOSURE

The present disclosure relates to a vehicle water-cooling heat sink plate and a vehicle water-cooling radiator, and more particularly to a vehicle water-cooling heat sink plate having fin sets with different fin pitch distances, and a closed vehicle water-cooling radiator using the same.

BACKGROUND OF THE DISCLOSURE

Radiators are widely used in various products. Generally speaking, higher-end products usually use water-cooling/liquid-cooling radiators, which have the advantages of quietness and stable cooling comparing with air-cooling radiators, but for automotive power chips that operate faster and faster, the current water-cooling radiator is still unable to meet the heat-dissipating requirements of the automotive power chips. Therefore, how to dissipate heat more effectively through the water-cooling technology is one of the issues that needs to be solved in the related field.

SUMMARY OF THE DISCLOSURE

In response to the above-referenced technical inadequacy, the present disclosure provides a vehicle water-cooling heat sink plate having fin sets with different fin pitch distances, and a closed vehicle water-cooling radiator using the same.

In one aspect, the present disclosure provides a vehicle water-cooling heat sink plate having fin sets with different fin pitch distances, which includes a heat-dissipating plate body, a first fin set, a second fin set and a third fin set, the heat-dissipating plate body having a first heat-dissipating surface and a second heat-dissipating surface opposite to each other, the first heat-dissipating surface being used for contacting a first, a second and a third traction inverter power component set, the first, the second and the third traction inverter power component set cooperating with each other to form an inverter power module and being used to generate three-phase alternating current for driving a motor of a vehicle, the second heat-dissipating surface being used for contacting a cooling fluid, the second heat-dissipating surface of the heat-dissipating plate body along a flow direction of the cooling fluid being divided into a first, a second and a third heat-dissipating area which are spaced apart from each other and have the same size, the first, the second and the third fin set being respectively located on the first, the second and the third heat-dissipating area, and a first, a second and a third projection area respectively generated by the first, the second and the third traction inverter power component set being projected onto the second heat-dissipating surface respectively defined as the first, the second and the third heat-dissipating area; in which an average fin pitch of any two adjacent fins of the first fin set located in the first heat-dissipating area is greater than or equal to an average fin pitch of any two adjacent fins of the second fin set located in the second heat-dissipating area; in which the average fin pitch of the any two adjacent fins of the second fin set located in the second heat-dissipating area is greater than or equal to an average fin pitch of any two adjacent fins of the third fin set located in the third heat-dissipating area; in which the average fin pitch of the any two adjacent fins of the first fin set located in the first heat-dissipating area is greater than the average fin pitch of the any two adjacent fins of the third fin set located in the third heat-dissipating area.

In one of the preferred embodiments, each of the first, the second and the third fin set has a plurality of plate-shaped fins arranged in parallel.

In one of the preferred embodiments, a length direction of each fin of the first fin set located in the first heat-dissipating area is parallel to the flow direction of the cooling fluid or inclined at an included angle fewer than 5 degrees relative to the flow direction of the cooling fluid; in which a length direction of each fin of the second fin set located in the second heat-dissipating area is inclined at an included angle of 5 to 20 degrees relative to the flow direction of the cooling fluid; in which a length direction of each fin of the fin set located in the third heat-dissipating area is inclined at an included angle of 5 to 25 degrees relative to the flow direction of the cooling fluid, and an inclination direction of each fin of the second fin set is different from an inclination direction of each fin of the third fin set.

In one of the preferred embodiments, the average fin pitch of the any two adjacent fins of the first fin set located in the first heat dissipation area is between 0.5 mm and 5 mm; in which the average fin pitch of the any two adjacent fins of the third fin set located in the third heat dissipation area is between 0.2 mm and 2 mm, and a difference between the average fin pitches of the fins of the fin set in any two adjacent ones of the first, the second and the third heat dissipation areas is between 0.1 mm and 1 mm.

In another aspect, the present disclosure provides a vehicle water-cooling heat sink plate having fin sets with different fin pitch distances, which includes a heat-dissipating plate body, a first fin set, a second fin set and a third fin set, the heat-dissipating plate body having a first heat-dissipating surface and a second heat-dissipating surface opposite to each other, the first heat-dissipating surface being used for contacting a first, a second and a third traction inverter power component set, the first, the second and the third traction inverter power component set cooperating with each other to form an inverter power module and being used to generate three-phase alternating current for driving a motor of a vehicle, the second heat-dissipating surface being used for contacting a cooling fluid, the second heat-dissipating surface of the heat-dissipating plate body along a flow direction of the cooling fluid being divided into a first, a second and a third heat-dissipating area which are spaced apart from each other and have the same size, the first, the second and the third fin set being respectively located on the first, the second and the third heat-dissipating area, and a first, a second and a third projection area respectively generated by the first, the second and the third traction inverter power component set being projected onto the second heat-dissipating surface respectively defined as the first, the second and the third heat-dissipating area; in which an average centroid distance of any two adjacent fins of the first fin set located in the first heat-dissipating area is greater than or equal to an average centroid distance of any two adjacent fins of the second fin set located in the second heat-dissipating area; in which the average centroid distance of the any two adjacent fins of the second fin set located in the second heat-dissipating area is greater than or equal to an average centroid distance of any two adjacent fins of the third fin set located in the third heat-dissipating area; in which the average centroid distance of the any two adjacent fins of the first fin set located in the first heat-dissipating area is greater than the average centroid distance of the any two adjacent fins of the third fin set located in the third heat-dissipating area.

In one of the preferred embodiments, each of the first, the second and the third fin set has a plurality of pin-shaped fins arranged in a high density.

In one of the preferred embodiments, the average centroid distance of the any two adjacent fins of the first fin set located in the first heat dissipation area is between 1 mm and 10 mm; in which the average centroid distance of the any two adjacent fins of the third fin set located in the third heat dissipation area is between 0.5 mm and 4 mm; in which a difference between the average centroid distances of the fins of the fin set in any two adjacent ones of the first, the second and the third heat dissipation areas is between 0.1 mm and 1 mm.

In yet another aspect, the present disclosure provides a closed vehicle water-cooling radiator, which includes a vehicle water-cooling heat sink plate having fin sets with different fin pitch distances. The vehicle water-cooling heat sink plate includes a heat-dissipating plate body, a first fin set, a second fin set and a third fin set, the heat-dissipating plate body having a first heat-dissipating surface and a second heat-dissipating surface opposite to each other, the first heat-dissipating surface being used for contacting a first, a second and a third traction inverter power component set, the first, the second and the third traction inverter power component set cooperating with each other to form an inverter power module and being used to generate three-phase alternating current for driving a motor of a vehicle, the second heat-dissipating surface being used for contacting a cooling fluid, the second heat-dissipating surface of the heat-dissipating plate body along a flow direction of the cooling fluid being divided into a first, a second and a third heat-dissipating area which are spaced apart from each other and have the same size, the first, the second and the third fin set being respectively located on the first, the second and the third heat-dissipating area, and a first, a second and a third projection area respectively generated by the first, the second and the third traction inverter power component set being projected onto the second heat-dissipating surface respectively defined as the first, the second and the third heat-dissipating area. In one of the preferred embodiments, an average fin pitch of any two adjacent fins of the first fin set located in the first heat-dissipating area is greater than or equal to an average fin pitch of any two adjacent fins of the second fin set located in the second heat-dissipating area, the average fin pitch of the any two adjacent fins of the second fin set located in the second heat-dissipating area is greater than or equal to an average fin pitch of any two adjacent fins of the third fin set located in the third heat-dissipating area, and the average fin pitch of the any two adjacent fins of the first fin set located in the first heat-dissipating area is greater than the average fin pitch of the any two adjacent fins of the third fin set located in the third heat-dissipating area. In another one of the preferred embodiments, an average centroid distance of any two adjacent fins of the first fin set located in the first heat-dissipating area is greater than or equal to an average centroid distance of any two adjacent fins of the second fin set located in the second heat-dissipating area, the average centroid distance of the any two adjacent fins of the second fin set located in the second heat-dissipating area is greater than or equal to an average centroid distance of any two adjacent fins of the third fin set located in the third heat-dissipating area, and the average centroid distance of the any two adjacent fins of the first fin set located in the first heat-dissipating area is greater than the average centroid distance of the any two adjacent fins of the third fin set located in the third heat-dissipating area.

These and other aspects of the present disclosure will become apparent from the following description of the embodiment taken in conjunction with the following drawings and their captions, although variations and modifications therein can be affected without departing from the spirit and scope of the novel concepts of the disclosure.

BRIEF DESCRIPTION OF THE DRAWINGS

The described embodiments can be better understood by reference to the following description and the accompanying drawings, in which.

DETAILED DESCRIPTION OF THE EXEMPLARY EMBODIMENTS

Figure 1:
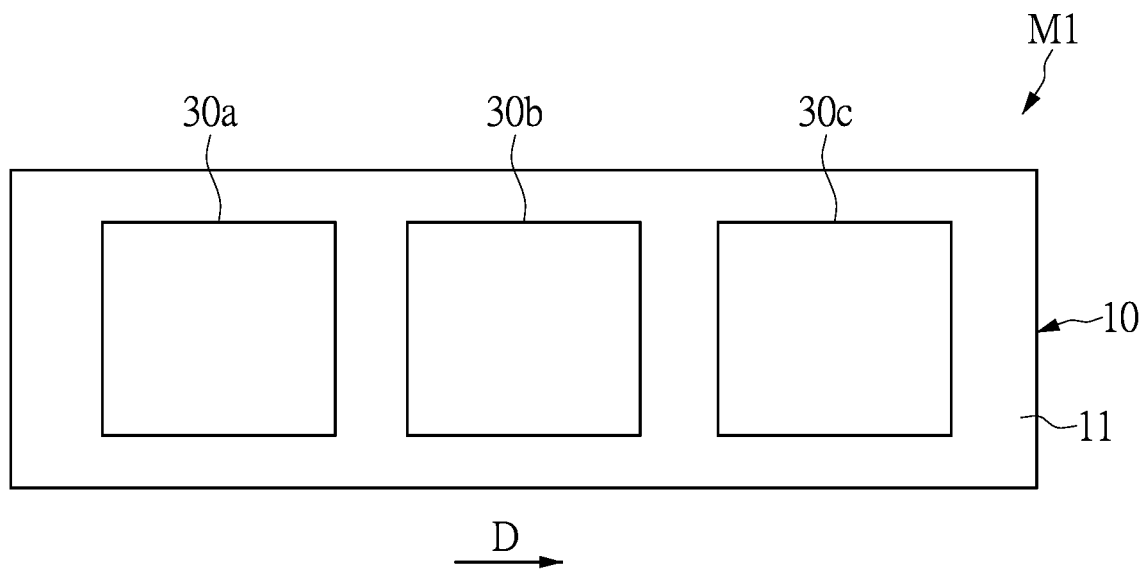
FIG. 1 is a schematic top view of a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
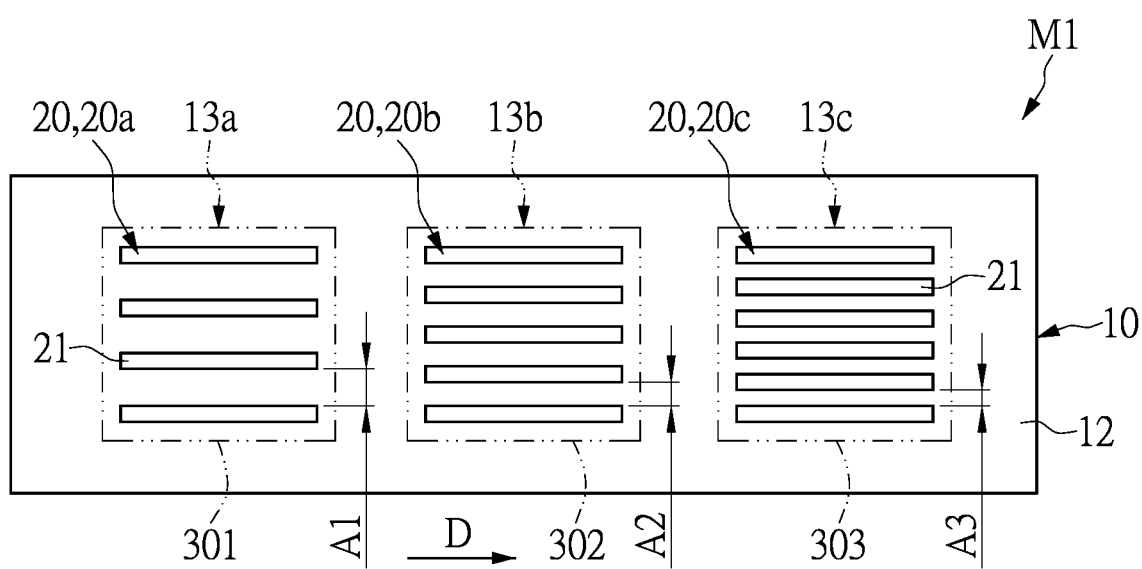
FIG. 2 is a schematic bottom view of the first embodiment of the present disclosure.

Referring to FIG. 1 and FIG. 2, which are one of the embodiments of the present disclosure. The embodiment of the present disclosure provides a vehicle water-cooling heat sink plate having fin sets with different fin pitch distances, which is used to be arranged in a closed type or a semi-open type vehicle water-cooling radiator. As shown in FIG. 1 and FIG. 2, the vehicle water-cooling heat sink plate having fin sets with different fin pitch distances (hereinafter referred to as a vehicle water-cooling heat sink plate M1) provided according to the embodiment of the present disclosure basically includes a heat-dissipating plate body 10, and three fin sets 20 (including a first fin set 20a, a second fin set 20b and a third fin set 20c).

In this embodiment, the heat-dissipating plate body 10 can be made of high thermal conductivity materials, such as copper, copper alloy, aluminum and aluminum alloy. The heat-dissipating plate body 10 has a first heat-dissipating surface 11 and a second heat-dissipating surface 12 opposite to each other. The first heat-dissipating surface 11 is used for contacting a first, a second and a third traction inverter power component set (30a, 30b, 30c), and the first, the second and the third traction inverter power component set (30a, 30b, 30c) cooperate with each other to form an inverter power module and are used to generate three-phase alternating current for driving a motor of a vehicle. The second heat-dissipating surface 12 is used for contacting a cooling fluid (e.g., water or ethylene glycol).

In this embodiment, one end of the heat-dissipating plate body 10 can be located at the upstream side of the cooling fluid, and another end of the heat-dissipating plate body 10 can be located at the downstream side of the cooling fluid, and the second heat-dissipating surface 12 of the heat-dissipating plate body 10 along a flow direction D of the cooling fluid can be divided into three heat-dissipating areas (such as a first, a second and a third heat-dissipating area 13a, 13b, 13c) which are spaced apart from each other and have the same size. Furthermore, the first heat-dissipating area 13a is located near the upstream side of the cooling fluid, the third heat-dissipating area 13c is located near the downstream side of the cooling fluid, and the second heat-dissipating area 13b is located between the first heat-dissipating area 13a and the third heat-dissipating area 13c.

In this embodiment, the first, the second and the third fin set (20a, 20b, 20c) are respectively located on the first, the second and the third heat-dissipating area (13a, 13b, 13c) of the second heat-dissipating surface 12. The first, the second and the third fin set (20a, 20b, 20c) are preferably integrally connected to the second heat-dissipating surface 12 of the heat-dissipating plate body 10 by metal injection molding (MIM), but can also be formed on the second heat-dissipating surface 12 of the heat-dissipating plate body 10 by forging, or can also be connected to the second heat-dissipating surface 12 of the heat-dissipating plate body 10 by welding or assembling. In addition, a first, a second and a third projection area (301, 302, 303) respectively generated by the first, the second and the third traction inverter power component set (30a, 30b, 30c) are projected onto the second heat-dissipating surface 12 respectively defined as the first, the second and the third heat-dissipating area (13a, 13b, 13c).

Furthermore, the average fin pitch A1 of any two adjacent fins 21 of the first fin set 20a located in the first heat-dissipating area 13a is greater than or equal to (≥) the average fin pitch A2 of any two adjacent fins 21 of the second fin set 20b located in the second heat-dissipating area 13b, the average fin pitch A2 of any two adjacent fins 21 of the second fin set 20b located in the second heat-dissipating area 13b is greater than or equal to (≥) the average fin pitch A3 of any two adjacent fins 21 of the third fin set 20c located in the third heat-dissipating area 13c, and the average fin pitch A1 of any two adjacent fins 21 of the first fin set 20a located in the first heat-dissipating area 13a must be greater than the average fin pitch of any two adjacent fins 21 of the third fin set 20c located in the third heat-dissipating area 13c. Therefore, the pressure drop of the fluid in the area close to the upstream side of the fluid can be minimized, so that the overall fluid pressure drop will not drop too much, which can avoid increasing the operating energy consumption of the water pump, and can ensure the temperature uniformity of the three traction inverter power component sets during the heat dissipating and cooling process.

In this embodiment, the fins 21 of each fin set 20 are each a plate-shaped fin and arranged in parallel, and the average fin pitch of the fins 21 of each fin set 20 is the average pitch of any two adjacent plate-shaped fins arranged in parallel. Furthermore, the length direction of each fin 21 of each fin set 20 is parallel to the flow direction D of the cooling fluid, or at an included angle fewer than 5 degrees relative to the flow direction D of the cooling fluid (that is to say, the length direction of each fin 21 of each fin set 20 is substantially parallel to the flow direction D of the cooling fluid).

More particularly, in order to ensure that the overall fluid pressure drop will not drop too much, and to ensure the temperature uniformity of the three traction inverter power component sets during the heat dissipating and cooling process, after continuous testing, the average fin pitch A1 of any two adjacent fins 21 of the first fin set 20a located in the first heat dissipation area 13a must be between 0.5 mm and 5 mm, and the average fin pitch A3 of any two adjacent fins 21 of the third fin set 20c located in the third heat dissipation area 13c (i.e., in the last heat dissipation area) must be between 0.2 mm and 2 mm, and the difference between the average fin pitches of the fins 21 of the fin set 20 in any two adjacent ones of the three heat dissipation areas must be between 0.1 mm and 1 mm.

Second Embodiment

Figure 3:
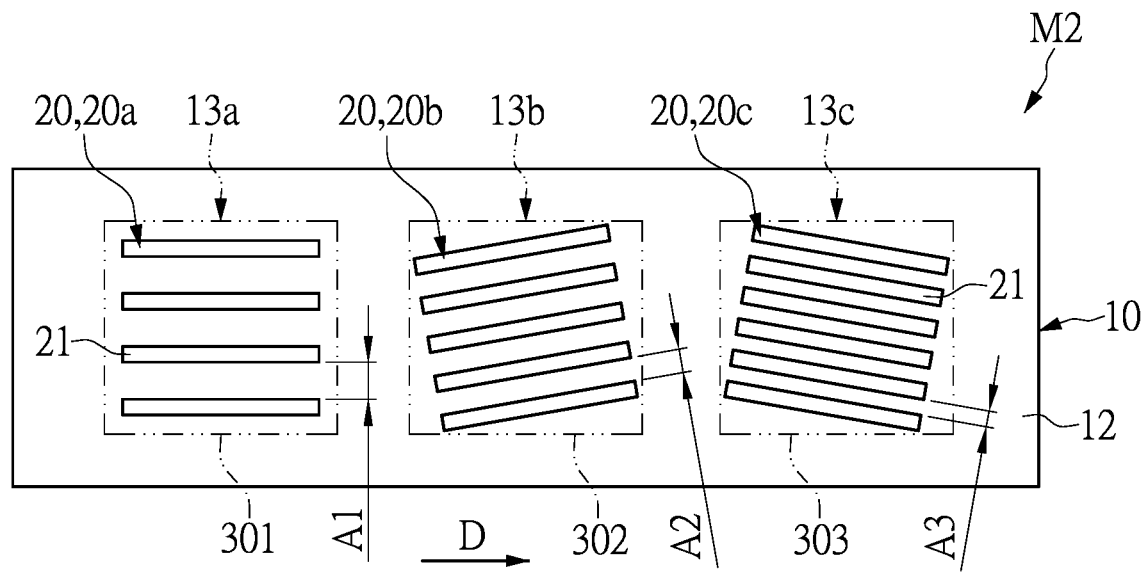
FIG. 3 is a schematic bottom view of a second embodiment of the present disclosure.
Figure 4:
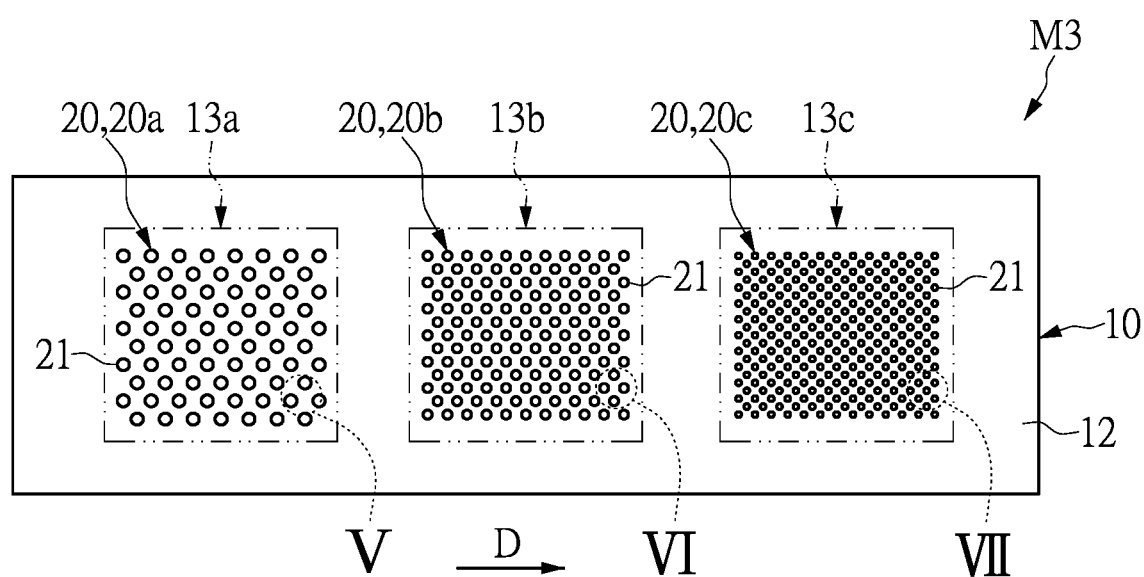
FIG. 4 is a schematic bottom view of a third embodiment of the present disclosure.

Referring to FIG. 3, which is a second embodiment of the present disclosure. This embodiment is substantially the same as the first embodiment, and the differences are described as follows.

This embodiment provides a vehicle water-cooling heat sink plate having fin sets with different fin pitch distances (hereinafter referred to as a vehicle water-cooling heat sink plate M2). In this embodiment, the length direction of each fin 21 of the first fin set 20a located in the first heat-dissipating area 13a is parallel to the flow direction D of the cooling fluid or inclined at an included angle fewer than 5 degrees relative to the flow direction D of the cooling fluid. The length direction of each fin 21 of the second fin set 20b located in the second heat-dissipating area 13b is inclined at an included angle of 5 to 20 degrees (preferably 15 degrees) relative to the flow direction D of the cooling fluid. The length direction of each fin 21 of the fin set 20c located in the third heat-dissipating area 13c is inclined at an included angle of 5 to 25 degrees (preferably 20 degrees) relative to the flow direction D of the cooling fluid, and the inclination direction of each fin 21 of the second fin set 20b is different from the inclination direction of each fin 21 of the third fin set 20c, thereby guiding the cooling fluid and increasing the contact time of the cooling fluid with the fins 21.

Third Embodiment

Referring to FIG. 4 to FIG. 7, which are a third embodiment of the present disclosure. This embodiment is substantially the same as the first embodiment, and the differences are described as follows.

Figure 5:
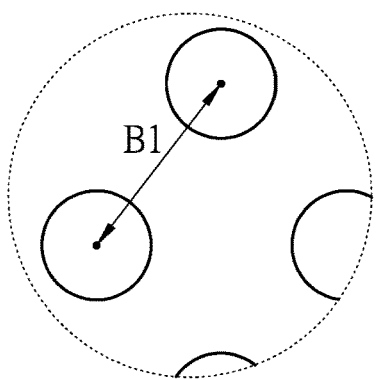
FIG. 5 is a schematic enlarged view of part V of FIG. 4.
Figure 6:
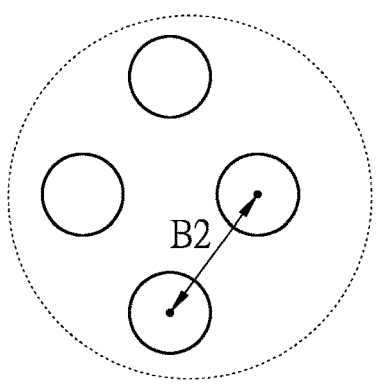
FIG. 6 is a schematic enlarged view of part VI of FIG. 4.
Figure 7:
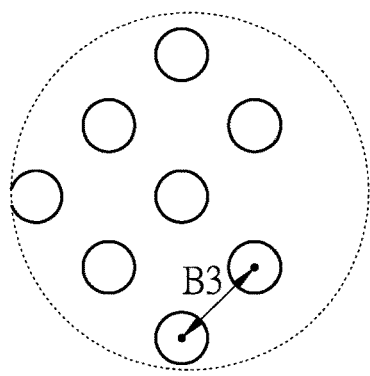
FIG. 7 is a schematic enlarged view of part VII of FIG. 4.

This embodiment provides a vehicle water-cooling heat sink plate having fin sets with different fin pitch distances (hereinafter referred to as a vehicle water-cooling heat sink plate M3). In this embodiment, the three fin sets 20 are respectively located in the three heat-dissipating areas, and the three projection areas respectively generated by the three spaced traction inverter power component sets are projected onto the second heat-dissipating surface 12 respectively defined as three heat-dissipating areas (such as a first, a second and a third heat-dissipating area (13a, 13b, 13c)). Furthermore, the first fin set 20a, the second fin set 20b, and the third fin set 20c of the three fin sets 20 are located in the first heat-dissipating area 13a, the second heat-dissipating area 13b, and the third heat-dissipating area 13c, respectively. Moreover, the average centroid distance B1 (i.e., the average fin pitch between the centers of mass) of any two adjacent fins 21 of the first fin set 20a located in the first heat-dissipating area 13a is greater than or equal to (≥) the average centroid distance B2 of any two adjacent fins 21 of the second fin set 20b located in the second heat-dissipating area 13b (as shown in FIG. 6), the average centroid distance B2 of any two adjacent fins 21 of the second fin set 20b located in the second heat-dissipating area 13b is greater than or equal to (≥) the average centroid distance B3 of any two adjacent fins 21 of the third fin set 20c located in the third heat-dissipating area 13c (as shown in FIG. 7), and the average centroid distance B1 of any two adjacent fins 21 of the first fin set 20a located in the first heat-dissipating area 13a (as shown in FIG. 5) must be greater than the average centroid distance B3 of any two adjacent fins 21 of the third fin set 20c located in the third heat-dissipating area 13c (as shown in FIG. 7).

In this embodiment, each fin 21 of each fin set 20 is a pin-shaped fin and the fins 21 of each fin set 20 are arranged in a high density (that is to say, the fins 21 of each fin set 20 are adjacent to each other), and the average centroid distance of the fins of each fin group 20 is the average fin pitch between the centers of mass of the pin-shaped fins arranged in a high density.

Furthermore, the cross-section of the pin-shaped fin in each heat-dissipating area can be circular, square, diamond, drop-shaped, oval or other shape. In this embodiment, the cross-section of each fin 21 located in the first heat-dissipating area 13a is circular, the cross-section of each fin 21 located in the second heat-dissipating area 13b is circular, and the cross-section of each fin 21 located in the third heat-dissipating area 13c is also circular, but the average area of the cross-section of the fins 21 located in the third heat-dissipating area 13c is smaller than the average area of the cross-section of the fins 21 located in the second heat dissipation area 13b.

More particularly, in order to ensure that the overall fluid pressure drop will not drop too much, and to ensure the temperature uniformity of the three traction inverter power component sets during the heat dissipating and cooling process, after continuous testing, the average centroid distance B1 of any two adjacent fins 21 of the first fin set 20a located in the first heat dissipation area 13a must be between 1 mm and 10 mm (the best is between 4 mm and 4.2 mm), the average centroid distance B2 of any two adjacent fins 21 of the second fin set 20b located in the second heat dissipation area 13b is preferably between 3.3 mm and 3.5 mm, the average centroid distance B3 of any two adjacent fins 21 of the third fin set 20c located in the third heat dissipation area 13c (i.e., in the last heat dissipation area) must be between 0.5 mm and 4 mm (the best is between 2.9 mm and 3.1 mm), and the difference between the average centroid distances of the fins 21 of the fin set 20 in any two adjacent ones of the three heat dissipation areas must be between 0.1 mm and 1 mm.

Fifth Embodiment

Figure 8:
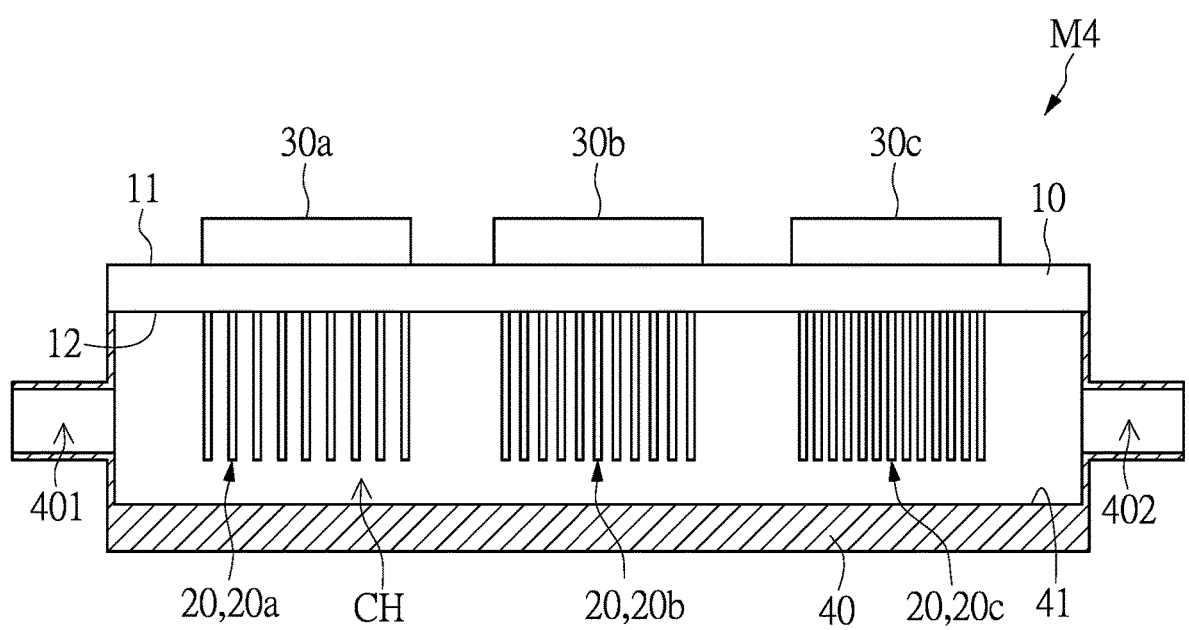
FIG. 8 is a schematic side view of a fourth embodiment of the present disclosure.

Referring to FIG. 8, which is a fifth embodiment of the present disclosure. This embodiment is substantially the same as the first embodiment, and the differences are described as follows.

In this embodiment, a closed vehicle water-cooling radiator M4 is provided. Furthermore, the closed vehicle water-cooling radiator M4 of this embodiment includes a heat-dissipating base 40 and a vehicle water-cooling heat sink plate having fin sets with different fin pitch distances as described in any of the foregoing embodiments. The heat-dissipating base 40 of the present embodiment has a groove 41 recessed therefrom, and the heat-dissipating base 40 is combined with the heat-dissipating plate body 10, so that a chamber CH is formed between the groove 41 of the heat-dissipating base 40 and the second heat-dissipating surface 12 of the heat-dissipating plate body 10, and the first fin set 20a, the second fin set 20b, and the third fin set 20c are located in the chamber CH. Furthermore, the heat-dissipating base 40 is further formed with a water inlet through hole 401 and a water outlet through hole 402 respectively communicated with the chamber CH, so that the cooling fluid can flow into the chamber CH through the water inlet through hole 401 and flow out of the chamber CH through the water outlet through hole 402, in order to further improve the heat-dissipating performance through the closed fluid circulation loop.

In conclusion, in the vehicle water-cooling heat sink plate having fin sets with different fin pitch distances, and the closed vehicle water-cooling radiator using the same provided by the present disclosure, by virtue of "the heat-dissipating plate body," "the first, the second and the third fin set," "the heat-dissipating plate body having a first heat-dissipating surface and a second heat-dissipating surface opposite to each other, the first heat-dissipating surface being used for contacting a first, a second and a third traction inverter power component set, the first, the second and the third traction inverter power component set cooperating with each other to form an inverter power module and being used to generate three-phase alternating current for driving a motor of a vehicle, and the second heat-dissipating surface being used for contacting a cooling fluid," "the second heat-dissipating surface of the heat-dissipating plate body along a flow direction of the cooling fluid being divided into a first, a second and a third heat-dissipating area which are spaced apart from each other and have the same size," "the first, the second and the third fin set being respectively located on the first, the second and the third heat-dissipating area, and a first, a second and a third projection area respectively generated by the first, the second and the third traction inverter power component set being projected onto the second heat-dissipating surface respectively defined as the first, the second and the third heat-dissipating area," and "an average fin pitch of any two adjacent fins of the first fin set located in the first heat-dissipating area being greater than or equal to an average fin pitch of any two adjacent fins of the second fin set located in the second heat-dissipating area, the average fin pitch of the any two adjacent fins of the second fin set located in the second heat-dissipating area being greater than or equal to an average fin pitch of any two adjacent fins of the third fin set located in the third heat-dissipating area, and the average fin pitch of the any two adjacent fins of the first fin set located in the first heat-dissipating area being greater than the average fin pitch of the any two adjacent fins of the third fin set located in the third heat-dissipating area" or "an average centroid distance of any two adjacent fins of the first fin set located in the first heat-dissipating area being greater than or equal to an average centroid distance of any two adjacent fins of the second fin set located in the second heat-dissipating area, the average centroid distance of the any two adjacent fins of the second fin set located in the second heat-dissipating area being greater than or equal to an average centroid distance of any two adjacent fins of the third fin set located in the third heat-dissipating area, and the average centroid distance of the any two adjacent fins of the first fin set located in the first heat-dissipating area being greater than the average centroid distance of the any two adjacent fins of the third fin set located in the third heat-dissipating area," the pressure drop of the fluid in the area close to the upstream side of the fluid can be minimized, so that the overall fluid pressure drop will not drop too much, which can avoid increasing the operating energy consumption of the water pump, and can ensure the temperature uniformity of the three traction inverter power component sets during the heat dissipating and cooling process.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A vehicle water-cooling heat sink plate having fin sets with different fin pitch distances, comprising: a heat-dissipating plate body, a first fin set, a second fin set and a third fin set, the heat-dissipating plate body having a first heat-dissipating surface and a second heat-dissipating surface opposite to each other, the first heat-dissipating surface being used for contacting a first, a second and a third traction inverter power component set, the first, the second and the third traction inverter power component set cooperating with each other to form an inverter power module and being used to generate three-phase alternating current for driving a motor of a vehicle, the second heat-dissipating surface being used for contacting a cooling fluid, the second heat-dissipating surface of the heat-dissipating plate body along a flow direction of the cooling fluid being divided into a first, a second and a third heat-dissipating area which are spaced apart from each other and have the same size, the first, the second and the third fin set being respectively located on the first, the second and the third heat-dissipating area, and a first, a second and a third projection area respectively generated by the first, the second and the third traction inverter power component set being projected onto the second heat-dissipating surface respectively defined as the first, the second and the third heat-dissipating area; wherein an average fin pitch of any two adjacent fins of the first fin set located in the first heat-dissipating area is greater than or equal to an average fin pitch of any two adjacent fins of the second fin set located in the second heat-dissipating area; wherein the average fin pitch of the any two adjacent fins of the second fin set located in the second heat-dissipating area is greater than or equal to an average fin pitch of any two adjacent fins of the third fin set located in the third heat-dissipating area; wherein the average fin pitch of the any two adjacent fins of the first fin set located in the first heat-dissipating area is greater than the average fin pitch of the any two adjacent fins of the third fin set located in the third heat-dissipating area.

2. The vehicle water-cooling heat sink plate according to claim 1, wherein each of the first, the second and the third fin set has a plurality of plate-shaped fins arranged in parallel.

3. The vehicle water-cooling heat sink plate according to claim 1, wherein a length direction of each fin of the first fin set located in the first heat-dissipating area is parallel to the flow direction of the cooling fluid or inclined at an included angle fewer than 5 degrees relative to the flow direction of the cooling fluid; wherein a length direction of each fin of the second fin set located in the second heat-dissipating area is inclined at an included angle of 5 to 20 degrees relative to the flow direction of the cooling fluid; wherein a length direction of each fin of the fin set located in the third heat-dissipating area is inclined at an included angle of 5 to 25 degrees relative to the flow direction of the cooling fluid, and an inclination direction of each fin of the second fin set is different from an inclination direction of each fin of the third fin set.

4. The vehicle water-cooling heat sink plate according to claim 3, wherein the average fin pitch of the any two adjacent fins of the first fin set located in the first heat dissipation area is between 0.5 mm and 5 mm; wherein the average fin pitch of the any two adjacent fins of the third fin set located in the third heat dissipation area is between 0.2 mm and 2 mm, and a difference between the average fin pitches of the fins of the fin set in any two adjacent ones of the first, the second and the third heat dissipation areas is between 0.1 mm and 1 mm.

5. A vehicle water-cooling heat sink plate having fin sets with different fin pitch distances, comprising: a heat-dissipating plate body, a first fin set, a second fin set and a third fin set, the heat-dissipating plate body having a first heat-dissipating surface and a second heat-dissipating surface opposite to each other, the first heat-dissipating surface being used for contacting a first, a second and a third traction inverter power component set, the first, the second and the third traction inverter power component set cooperating with each other to form an inverter power module and being used to generate three-phase alternating current for driving a motor of a vehicle, the second heat-dissipating surface being used for contacting a cooling fluid, the second heat-dissipating surface of the heat-dissipating plate body along a flow direction of the cooling fluid being divided into a first, a second and a third heat-dissipating area which are spaced apart from each other and have the same size, the first, the second and the third fin set being respectively located on the first, the second and the third heat-dissipating area, and a first, a second and a third projection area respectively generated by the first, the second and the third traction inverter power component set being projected onto the second heat-dissipating surface respectively defined as the first, the second and the third heat-dissipating area; wherein an average centroid distance of any two adjacent fins of the first fin set located in the first heat-dissipating area is greater than or equal to an average centroid distance of any two adjacent fins of the second fin set located in the second heat-dissipating area; wherein the average centroid distance of the any two adjacent fins of the second fin set located in the second heat-dissipating area is greater than or equal to an average centroid distance of any two adjacent fins of the third fin set located in the third heat-dissipating area; wherein the average centroid distance of the any two adjacent fins of the first fin set located in the first heat-dissipating area is greater than the average centroid distance of the any two adjacent fins of the third fin set located in the third heat-dissipating area.

6. The vehicle water-cooling heat sink plate according to claim 5, wherein each of the first, the second and the third fin set has a plurality of pin-shaped fins arranged in a high density.

7. The vehicle water-cooling heat sink plate according to claim 6, wherein the average centroid distance of the any two adjacent fins of the first fin set located in the first heat dissipation area is between 1 mm and 10 mm; wherein the average centroid distance of the any two adjacent fins of the third fin set located in the third heat dissipation area is between 0.5 mm and 4 mm; wherein a difference between the average centroid distances of the fins of the fin set in any two adjacent ones of the first, the second and the third heat dissipation areas is between 0.1 mm and 1 mm.

8. A closed vehicle water-cooling radiator, comprising the vehicle water-cooling heat sink plate as claimed in claim 1 and a heat-dissipating base, wherein the heat-dissipating base has a groove recessed therefrom, and the heat-dissipating base is combined with the heat-dissipating plate body, so that a chamber is formed between the groove of the heat-dissipating base and the second heat-dissipating surface of the heat-dissipating plate body, and the first, the second and the third fin set are located in the chamber.

9. A closed vehicle water-cooling radiator, comprising the vehicle water-cooling heat sink plate as claimed in claim 5 and a heat-dissipating base, wherein the heat-dissipating base has a groove recessed therefrom, and the heat-dissipating base is combined with the heat-dissipating plate body, so that a chamber is formed between the groove of the heat-dissipating base and the second heat-dissipating surface of the heat-dissipating plate body, and the first, the second and the third fin set are located in the chamber.

\* \* \* \* \*